United States Patent
Han et al.

(10) Patent No.: US 8,728,238 B2
(45) Date of Patent: May 20, 2014

(54) CRYSTAL GROWTH SYSTEM AND METHOD FOR LEAD-CONTAINED COMPOSITIONS USING BATCH AUTO-FEEDING

(71) Applicants: Pengdi Han, Bolingbrook, IL (US); Jian Tian, Napierville, IL (US)

(72) Inventors: Pengdi Han, Bolingbrook, IL (US); Jian Tian, Napierville, IL (US)

(73) Assignee: H.C. Materials Corporation, Bolingbrook, IL (US)

( * ) Notice: Subject to any disclaimer, the term of this patent is extended or adjusted under 35 U.S.C. 154(b) by 0 days.

(21) Appl. No.: 13/957,074

(22) Filed: Aug. 1, 2013

(65) Prior Publication Data
US 2013/0312657 A1     Nov. 28, 2013

Related U.S. Application Data

(63) Continuation of application No. 12/373,080, filed as application No. PCT/US2007/073412 on Jul. 12, 2007, now Pat. No. 8,535,442, said application No. 13/957,074 is a continuation-in-part of application No. 11/205,875, filed on Aug. 17, 2005, now abandoned, which is a continuation of application No. 10/288,042, filed on Nov. 4, 2002, now Pat. No. 6,942,730.

(60) Provisional application No. 60/830,139, filed on Jul. 12, 2006, provisional application No. 60/330,915, filed on Nov. 2, 2001.

(51) Int. Cl.
| | |
|---|---|
| C30B 35/00 | (2006.01) |
| C30B 13/28 | (2006.01) |
| C30B 15/30 | (2006.01) |
| C30B 11/00 | (2006.01) |
| C30B 13/00 | (2006.01) |
| C30B 21/04 | (2006.01) |
| C30B 28/08 | (2006.01) |

(52) U.S. Cl.
USPC .......... 117/223; 117/200; 117/202; 117/206; 117/219; 117/220

(58) Field of Classification Search
USPC ................. 117/200, 202, 206, 219, 220, 223
See application file for complete search history.

(56) References Cited

U.S. PATENT DOCUMENTS 4,613,784 A  *  9/1986  Haun et al. ............... 310/358
5,169,486 A  *  12/1992  Young et al. ............... 117/83

FOREIGN PATENT DOCUMENTS

CN       1227286       9/1999

OTHER PUBLICATIONS

PCT/US07/73412 filed Jul. 12, 2007, International Search Report and Written Opinion, 8 pages.

*Primary Examiner* — James McDonough
(74) *Attorney, Agent, or Firm* — Andrew F. Young, Esq.; Lackenbach Siegel, LLP (57) ABSTRACT

This invention includes a system and a method for growing crystals including a batch auto-feeding mechanism. The proposed system and method provide a minimization of compositional segregation effect during crystal growth by controlling growth rate involving a high-temperature flow control system operable in an open and a closed loop crystal growth process. The ability to control the growth rate without corresponding loss of volatilize-able elements enables significantly improvement in compositional homogeneity and a consequent increase in crystal yield. This growth system and method can be operated in production scale, simultaneously for a plurality of growth crucibles to further the reduction of manufacturing costs, particularly for the crystal materials of binary or ternary systems with volatile components, such as Lead (Pb) and Indium (In).

6 Claims, 6 Drawing Sheets

CRYSTAL GROWTH SYSTEM AND METHOD FOR LEAD-CONTAINED COMPOSITIONS USING BATCH AUTO-FEEDING

CROSS REFERENCE TO RELATED APPLICATIONS

This application is a continuation of, and claims priority, from U.S. application Ser. No. 12/373,080 filed Jan. 9, 2009 (allowed) which claims priority to PCT Application Serial No. PCT/US07/73412 filed Jul. 12, 2007 and, U.S. Provisional Application Ser. No. 60/830,139, filed Jul. 12, 2006, the entire contents of which are herein incorporated by reference. This application is also a continuation-in-part of U.S. application Ser. No. 11/205,875 filed Aug. 17, 2005 (abandoned), which in turn claims priority to U.S. application Ser. No. 10/288,042 filed Nov. 4, 2002, now U.S. Pat. No. 6,942,730 issued Sep. 13, 2005, and U.S. Prov. App. Ser. No. 60/330,915 filed Nov. 2, 2001, the entire contents of each of which are herein incorporated by reference.

SELECTED FIGURE FOR PUBLICATION

FIG. 2

GOVERNMENT SPONSORSHIP

None

BACKGROUND OF THE INVENTION

1. Field of the Invention

The present invention relates to a system and a method for ceramic crystallization and single crystal growth, particularly designed for the material systems with compositional segregation during solidification. More specifically, this invention relates to (i) crystal growth systems and methods derived in part from a vertical Bridgman approach for volatilizing ternary and binary solid solutions including lead-contained ternary or binary solid solutions, including but not limited for PMN-PT based crystals (lead magnesium niobate-lead titanate solid solutions); (ii) a batch auto-feeding system and mechanism with high temperature batch flow control operation and (iii) an automation control system for operably controlling a crystal growth processes. The proposed system and methods are This invented crystal growth method is particularly used for growing crystals of lead-contained binary and ternary solid solutions to minimize the compositional segregation effect.

2. Description of the Related Art

Acoustic transducers are the operational center of many medical, commercial, and military imaging systems. The most common types of transducers utilize lead zirconate titanate (PZT) based ceramics as a piezoelectric function. Piezoelectric ceramics convert mechanical energy into electrical energy and conversely electrical energy into mechanical energy. While conventional PZT materials remain the most common materials used in acoustic transduction devices, changing material requirements have fostered the need for new piezoelectric materials having improved dielectric, piezoelectric and mechanical properties.

Single crystals of solid solutions of $Pb(Mg_{1/3}Nb_{2/3})O_3$ (PMN) and $Pb(Zn_{1/3}Nb_{2/3})O_3$ (PZN) with $PbTiO_3$ (PT) (PMN-PT and PZN-PT) have generally desirable ultrahigh piezoelectric properties, coupling constants ($k_{33}$), and dielectric constants that are unachievable in conventional piezoelectric (PZT) ceramics.

At ambient temperatures, the morphotropic phase boundary (MPB), separating rhombohedral phase from tetragonal phase, exists in (1−x)PMN-xPT system at about x=0.34, and in (1−x)PZN-xPT system at about x=0.09. The crystals of compositions close to the MPB, the so-called relaxor-based single crystals, have shown greatly desired piezoelectric properties suitable for use in medical imaging devices. Unfortunately, the electromechanical properties of these types of single crystals are very sensitive to the orientation and chemical composition of the crystal (See for example U.S. Pat. No. 6,465,937 issued Oct. 10, 2002, the entire contents of which are herein incorporated by reference), and have been very hard if not impossible to produce in commercial, reliable, and homogenous quantities.

In early 1980s, Kuwata et al. (J. Kumata, K. Uchino and S. Nomura, *Dielectric and piezoelectric properties of* $0.91Pb(Zn_{1/3}Nb_{2/3})O_3$-$0.09PbTiO_3$, Jpn. J. Appl. Phys., 21, 1298-1302 (1982)) found very high piezoelectric coefficient, $d_{33}$, of 1500 pC/N and electromechanical coupling factor, $k_{33}$, of 0.92 in 0.91PZN-0.09PT single crystals along <001> direction.

Later, high properties were also observed in PMN-PT crystals by Shrout and his co-workers in 1990 (T. R. Shrout, Z. P. Chang, N. Kim and S. Markgraf, *Dielectric behavior of single crystals near the* $(1-x)Pb(Mg_{1/3}Nb_{2/3})O_3$-$x$ $PbTiO_3$ *Morphotropic Phase Boundary*, Ferroelectrics Lett., 12, 63-69 (1990)).

High electromechanical coupling ($k_{33}$)>90%, piezoelectric coefficient ($d_{33}$)>2500 pC/N and large strain up to 1.7% were reproducibly observed in the later 1990's (S. E. Park and T. R. Shrout, *Ultrahigh strain and piezoelectric behavior in relaxor based ferroelectric single crystals*, J. Appl. Phys., 82, 1804-11 (1997)).

The super-high piezoelectric properties noted in this literature promised a new generation of acoustic transduction devices but unfortunately were highly difficult to manufacture using any known method.

The small single crystals of PMN-PT and PZN-PT discovered above were obtained by a conventional flux growth method. Unfortunately, usefully sized single crystals (at least inch size) of good quality were long unavailable until in 1997 when PZN-PT single crystals were grown by improved flux growth methods. See S. E. Park and T. R. Shrout, *Characteristics Of Relaxor-Based Piezoelectric Single Crystal For Ultrasonic Transducers*, IEEE Trans. On Ultrasonics, Ferroelectrics and Frequency Control, Vol. 44, No. 5, 1140-1147 (1997); and T. Kobayashi, S. Shimanuki, S. Saitoh, and Y. Yamashita, *Improved Growth Of Large Lead Zinc Niobate Titanate Piezoelectric Single Crystals For Medical Ultrasonic Transducers*, Jpn. J. Appl. Phys., 36, 6035-38 (1997).

A conventional Bridgman method (P. W. Bridgman, Proc. Am. Acad. Sci. 60 9 (1925) 303) is characterized by a relative translation of a crucible containing a melt along a single axial temperature gradient in a vertical furnace. A Stockbarger method (D. C. Stockbarger, Ref Sci. Instrum 7 (1963) 133) is a modification of the Bridgman method and employs a single heat insulation buffer separating a vertical furnace into only two zones, a high temperature zone and an upper low-temperature zone.

Recently, a modified vertical Bridgman growth method was developed for large sized crystals: PZN-PT single crystals associated with flux (Y. Hosono, K. Harada, S. Shimanuki, S. Saitoh, and Y. Yamashita, *Crystal Growth And Mechanical Properties Of* $Pb(Zn_{1/3}Nb_{2/3})O_3$—$PbTiO_3$ *Single Crystal Produced By Solution Bridgman Method*, Jpn. J. Appl. Phys., 38, 5512-15 (1999)) and PMN-PT single crystals using a crucible moving-downward method in a temperature gradient (Chinese Pat. No. CN 1227286A, "Method Of Preparation Of Relaxor Ferroelectric Single Crystal Lead Magnesium Niobate-Lead Titanate" by H. Luo et al., published Sep. 1, 1999 and H. Luo, G. Xu, H. Xu, P. Wang, and Z. Yin, *Compositional Homogeneity And Electrical Properties Of Lead Magnesium Niobate Titanate Single Crystals Grown By A Modified Bridgman Technique*, Jpn. J. Appl. Phys., 39, 5581-85 (2000).

Unfortunately, substantial challenges still exist in manufacturing piezoelectric single crystals. One challenge is that a lead-contained melt, at high temperature, is made highly toxic through the evaporation (volatilization) of lead oxide and corresponding and detrimental increases compositional segregation due to the loss of critical elements. This challenge alone eliminates commercially viable and available crystal growth techniques. Further, the electromechanical properties of the relaxor-based PMN-PT crystals with 25~35% PT contents close to the MPB are critically sensitive to the PT content and the evaporation generates wildly variable electromechanical properties. An additional challenge is that crystal growth with flux association yields a very low growth rate and unacceptable imperfection manifestations, including micro inclusions drastically dropping yield. Finally, each of these methods provides poor homogeneity and greatly reduced material utilization factors raising production costs (material losses).

It is also clear that the Bridgman-type growth method alone is only feasible for PMN-PT crystal due to the pseudo-congruent behavior of the binary solid solution system. So far no publications gave the reason for this behavior and there is no calculable way to predict it due to the absence of most important of the thermodynamic parameters. (Only the experimental results, presented herein indicate the crystallization behavior.)

Referring now to the Bridgman growth method discussed above, this method allows for PMN-PT crystal growth at relatively fast rates, up to 1 mm/hr, but the resultant compositional segregation is detrimentally large generating tremendous yield loss via PT loss. The PT variability provides unpredictable and undesirable piezoelectric properties reducing material utilization to a vary small range. The resultant compositional segregations prevent commercial implementation of rapid growth rates without unacceptably high quality control losses.

Figure 1:
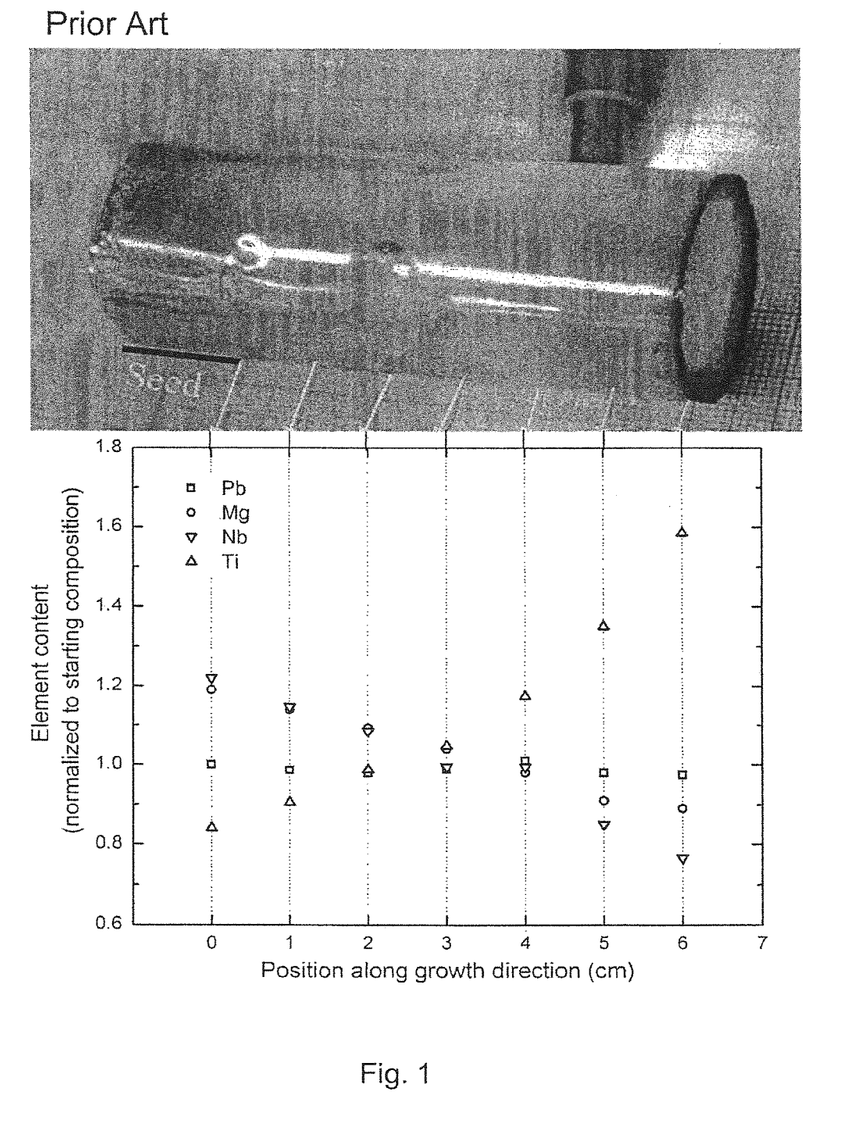
FIG. 1 is a diagram of the conventional compositional segregation effect, measured by ICP, on a PMN-32% PT single crystal boule grown by a conventional Bridgman growth method and a photograph of the boule is examined noting compositional segregation occurs along the growth direction.

Referring now to FIG. 1, a conventional single PMN-PT crystals was grown using solely the Bridgman growth method and the results are noted in the accompanying graph. Clearly the segregation results using this conventional growth method and system resulted in great Pb, Mg, Nb, and Ti variability along the length of the grown boule. The growth parameters were: seeding [110], growth rate 0.8 mm/hr at temperature gradient 30° C./cm, and maximum crucible temperature of 1365° C. The Induction Coupled. Plasma (ICP) spectroscopy employed had accuracy greater than 0.5%. It is clear from the figure that there is wide compositional variability along the length of the boule. This variability is drastically significant even within 1 cm length increments effectively rendering the entire boule unusable. It is clear that this method of crystal growth is incapable of providing useful lengths of compositionally homogenous material.

As noted above, since the piezoelectric properties of PMN-PT single crystals are sharply dependant upon composition, this composition variability results in a great reduction of the useful portion of the as-grown crystal boule, and increased production, handling, and testing costs. As seen in the FIG. 1, the percentage % of each of the compositional changes is as much as 10-25% within 1 cm length. This variability is unacceptable for commercial implementation.

Consequently a long felt need existed for an improved approach and Applicant has developed a hybrid method: Zone-leveling Bridgman approach to manufacture large-sized PMN-PT crystals with greatly improved compositional homogeneity (See U.S. Pat. No. 6,942,730, the entire contents of which are herein incorporated by reference). However, upon further practice of Applicant's patented invention, additional limitations were realized. Consequently Applicant's '730 invention is now recognized as only partially solving the segregation problem due to the limitation of size of the melting zone for large diameter crystals and other factors discussed below.

While it was suggested that a continuous feed of raw materials may assist the compositional change taking place in the liquid phase the continuous feed method is suitable only to Mn—Zn Ferrite that has an extremely low melting point and less or no volatility when compared to Pb-contained PMN-PT compound. (See the book chapter "*Crystals for magnetic applications*" in series of "*Crystals growth, properties and applications*", edited by C. J. M. Rooijmans, Springer-Verlag, Berlin Heidelberg, 1978. Consequently, the related art has failed to appreciate the need for a system and method that overcomes the detriments noted above.

In summary, the problems of commercially available manufacturing methods for PMN-PT based single crystals include at least the following:
1. low unit yield and high manufacturing cost due to loss in the process.
2. gross compositional inhomogeneity resulting in variation of piezoelectric properties rendering the resultant product wholly unsuitable for commercial use.

Accordingly there is a need for an improved crystal growth system and method that addresses the commercial needs discussed. Additionally, and alternatively, there is a need for a composition that operates with the proposed system and method.

ASPECTS AND SUMMARY OF THE INVENTION

An aspect of the present invention is to provide a response to at least one of the detriments noted above.

Another alternative aspect of the present invention is to provide an auto-feeding Bridgman method for directed crystal growth providing large sized single crystals of PMN-PT based binary or ternary solid solutions with significantly increased homogeneity and utilization.

Another alternative aspect of the present invention is to provide a method for directed crystallization and growth of crystals of lead magnesium niobate-lead titanate (PMN-PT) based solid solutions and related piezocrystals (binary or ternary systems), which is both cost effective and commercially acceptable Another alternative aspect of the present invention is to increase the quality and the reliability of production for large-sized crystals of lead magnesium niobate (PMN)-lead titanate (PT) based solid solutions and related piezocrystal.

Another alternative aspect of the present invention is to provide an auto-loading Bridgman growth method for directed crystallization growth that achieves improved compositional homogeneity along the length of as-grown crystal boules, and which provides particular advantages involving volatilizing compositions.

The present invention relates to a system and a method for growing crystals including a batch auto-feeding mechanism.

The proposed system and method provide a minimization of compositional segregation effect during crystal growth by controlling growth rate involving a high-temperature flow control system operable in an open and a closed loop crystal growth process. The ability to control the growth rate without corresponding loss of volatilize-able elements enables significantly improvement in compositional homogeneity and a consequent increase in crystal yield. This growth system and method can be operated in production scale, simultaneously for a plurality of growth crucibles to further the reduction of manufacturing costs, particularly for the crystal materials of binary or ternary systems with volatile components such as Lead (Pb) and Indium (In).

The present invention relates to a crystal growth method incorporating an auto-feeding-type crystal growth system with a precisely directed crystallization and a crystal growth process employing a high temperature flow-control valve mechanism. More particularly, the present invention provides for the manufacture of large-sized crystals of lead magnesium niobate-lead titanate (PMN-PT) solid solutions and related piezocrystals such PIN-PMN-PT and PYbN-PMN-PT and etc.

The merits (advantages) of the present crystal growth method include cost effectiveness produced through enabling significantly improved better compositional homogeneity along the length of as-grown boules. These results stem from employing a controllable batch auto-feeding mechanism when compared to known Bridgman/Stockbarger crystal growth methods. It is proposed that the present crystal growth invention method may be used commercially to manufacture single crystals of lead magnesium niobate-lead titanate solid solutions and related piezocrystals of ternary systems, such as PIN-PT-PMN, PYbN-PMN-PT and BiSc-PMN-PT ternary systems.

According to one alternative embodiment of the present invention there is provided a crystal growth system, comprising: at least one vertical furnace, at least one means for inputting thermal energy in the vertical furnace, at least a first thermal boundary member adjacent a top side of the thermal in-put means, at least a second thermal boundary member adjacent a bottom side of the thermal in-put means, and the at least first and second thermal boundary members effective to divide the vertical furnace into at least one narrow high-temperature zone, at least one upper sub-high-temperature zone, and at least one lower low-temperature zone during a use of the vertical furnace, whereby the upper sub-high temperature zone has a medium temperature over the melting point that is for keeping the molten state of the chemical batch in the batch reservoir.

According to another alternative embodiment of the present invention there is provided a crystal growth system, wherein at least one platinum crucible is used for the crystallization.

According to another alternative embodiment of the present invention there is provided a crystal growth system, wherein the platinum crucible has a volume between 500 cc and 5000 cc.

According to another alternative embodiment of the present invention there is provided a crystal growth system, wherein the wall of the crucible has a thickness T between 0.3 mm and 1.9 mm.

According to another alternative embodiment of the present invention there is provided a crystal growth system, wherein at least one platinum container is used as the nutrition reservoir to hold the molten batch.

According to another alternative embodiment of the present invention there is provided a crystal growth system, wherein the platinum container has a volume between 1000 cc and 8000 cc.

According to another alternative embodiment of the present invention there is provided a crystal growth system, wherein the wall of the container has a thickness T between 0.5 mm and 1.5 mm, to as much as 3.0 mm.

According to another alternative embodiment of the present invention there is provided a crystal growth system, further comprising: at least one operable platinum conduit between a batch reservoir and crucible for growth.

According to another alternative embodiment of the present invention there is provided a crystal growth system, wherein the wall of platinum conduit is between 0.5 mm to 1.0 mm, to as much as 3.0 mm.

According to another alternative embodiment of the present invention there is provided a crystal growth system, further comprising: at least one high temperature flow control mechanism to regulate the batch molten flow. The control system can be closed-loop or open-loop.

According to another alternative embodiment of the present invention there is provided a crystal growth system further comprising: means for thermally monitoring at least a first temperature of the thermal in-put means, a second temperature of the crucible in the high-temperature zone, and a third temperature adjacent a base portion of the crucible, means for positioning the crucible assembly relative to the high-temperature zone during the use, the positioning means moving the crucible assembly relative to the high-temperature zone at a rate R between at least 0.05 mm and 10.0 mm/hr during the use, means for controlling and interfacing with the means for inputting, the means for positioning, and the means for thermally monitoring and operating the crystal growth system during the use.

According to another alternative embodiment of the present invention there is provided a crystal growth system, wherein a maximum thermal gradient (G1) between the upper and the lower low-temperature zones is from about 10 to 50° C./cm, and more preferably from about 10° C./cm to about 30° C./cm.

According to another alternative embodiment of the present invention there is provided a method of forming a crystalline based material, comprising the steps of: providing a precursor material, loading at least the precursor material into at least one crucible placing the now-loaded crucible into a rigid ceramic member.

According to another alternative embodiment of the present invention there is provided a method of forming a crystalline based material, comprising the steps of: providing a precursor material, loading at least the precursor material into at least one platinum crucible placing the now-loaded crucible into a rigid ceramic member, filling a space formed between the crucible and the ceramic member with at least one powdered ceramic for support and forming a reservoir assembly, providing a vertical furnace assembly containing at least a high-temperature zone, an upper sub-high-temperature zone, and a lower low-temperature zone, inserting each the crucible assembly into the furnace assembly and positioning each the crucible assembly on a means for positioning the crucible relative to the high-temperature zone, providing a means for controlling of the crucible assembly, the furnace assembly, and the means for positioning, operating the furnace assembly and forming an as-grown crystalline material in the crucible at a rate from 0.15 to 1.0 mm/hr, and maintaining a temperature gradient at a growth interface in the crucible adjacent the high-temperature zone of from 10° C./cm to about 40° C./cm during the step of operating to form the crystalline material.

According to another alternative embodiment of the present invention there is provided a method of forming a crystalline based material, comprising the steps of: providing a precursor material, loading at least the precursor material into at least one platinum reservoir placing the now-loaded reservoir container into a rigid ceramic member, filling a space formed between the reservoir container and the ceramic member with at least one powdered ceramic and forming a reservoir assembly, providing an upper vertical furnace assembly, wherein: the

According to another alternative embodiment of the present invention there is provided a method of forming a crystalline based material, wherein: the precursor material includes a PMN-PT-based material.

According to another embodiment of the present invention there is provided a method of forming a crystalline based material wherein the PMN-PT based material is, the selected composition having at least one of the following formulas:

$$Pb(Mg_{1/3}Nb_{2/3})_{1-x}Ti_xO_3 \quad (I)$$

Wherein x is defined as molar % 0.00 to 0.50
And, $$(1-y)Pb(Mg_{1/3}Nb_{2/3})_{1-x}Ti_xO_3+yPb(R_{1/2}Nb_{1/2})O3 \quad (II)$$

wherein x is defined as molar % 0.00 to 0.50, y is defined as Molar % 0.00 to 0.35, and R is selected from at least one element of Bi, Fe, Sc, Yb, Sb, In, Co, and Zr, or a combination of the above elements.

Those of skill in the art will also recognize that formula (II) may be alternatively represented as:

$$(1-x-y)Pb(Mg_{1/3}Nb_{2/3})O_3+xPbTiO_3+yPb(R_{1/2}Nb_{1/2})O_3 \quad (IIA)$$

According to another alternative embodiment of the present invention there is provided a method of forming a crystalline based material, wherein: the precursor material is the selected composition according to chemical formula I, and the step of loading includes the steps of selecting at least one seed crystal and placing the seed crystal at a bottom of the crucible prior to loading the precursor material.

According to another alternative embodiment of the present invention there is provided a method of forming a crystalline based material, wherein: the at least one crystal seed has an orientation including at least one of a <001>, <110>, <112> and <111> orientation.

According to another alternative embodiment of the present invention there is provided a crystalline element, formed by a process described above, comprising: a ceramic material having a chemical formula as discussed herein according to at least one of formula I or II, and as incorporated herein.

According to another alternative embodiment of the present invention there is provided a crystalline element, wherein the crystalline element has a chemical formula as discussed herein according to formula II as incorporated herein and a depoling temperature of greater than 100° C., and more preferably greater than 90° C.

According to another embodiment of the present invention there is provided a crystalline element, wherein the crystalline element has a chemical formula according to formula II and an electrical coercive field of greater than 2.5 kV/cm and more preferably 3.0 kV/cm, and even more preferably greater than 3.5 kV/cm depending upon a desired manufacturer use.

According to another embodiment of the present invention there is provided a crystalline element, formed by a previously described method, wherein: at least one of a longitudinal and a thickness direction of the crystalline element is <001> orientation and the crystalline element has an effective electro-mechanical coupling factor of at least 0.90.

According to another embodiment of the present invention there is provided a method of forming a crystalline piezoelectric based material, wherein the step of operating further comprises the steps of: ramping a furnace temperature, up to less than 1480° C., at a rate of 100° C./hr, holding the furnace temperature at 1430~1480° C. for 3 to 8 hrs, while operably adjusting positions of each crucible assembly and regulating the furnace temperature to confirm the following conditions for each respective crucible during the hold time:
  (a) maximum temperature in a melting zone of less than about 1365° C.,
  (b) temperature of a reservoir in upper sub-high temperature zone is between 1300 to 1350° C.,
  (c) vertical temperature gradient at a middle of a crystal seed of greater than 15° C./cm, and more preferably greater than 20° C./cm, and
  (d) crucible equilibrium temperature within +/−2° C./hr change, and soaking each crucible for a minimum 2 hours after achieving the above-defined equilibrium crucible temperature, to begin a crystal growth period.

According to another embodiment of the present invention there is provided a PMN-PT based material, comprising: a single crystal, and the single crystal having a formula:

$$(1-y)Pb(Mg_{1/3}Nb_{2/3})_{1-x}Ti_xO_3+yPb(R_{1/2}Nb_{1/2})O3 \quad (III)$$

wherein x is defined as molar % 0.00 to 0.50, y is defined as molar % 0.00 to 0.35, and R is selected from at least one element of Bi, Fe, Sc, Yb, Sb, In, Co, and Zr, or a combination of the above elements.

According to yet another alternative and optional aspect of the present invention, a crystal growth system is provided, comprising: at least one vertical furnace, at least one means for inputting thermal energy in the vertical furnace, at least a first high temperature zone for crystal growth at least a second low temperature zone to create necessary temperature gradient for crystal growth at least one crucible, wherein the crystal growth takes place, and at least one of molten batch reservoir for continues feeding nutrition for crystal growth.

According to another alternative and optional aspect of the present invention, a crystal growth system is provided, wherein the materials for the crucible include pure platinum.

According to another alternative and optional aspect of the present invention, a crystal growth system is provided, where in the materials for the reservoir include pure platinum.

According to another alternative and optional aspect of the present invention, a crystal growth system is provided, further comprising: a ceramic member in the crucible assembly, the outer surface being an outer boundary of the ceramic member, a crucible in the crucible assembly, the crucible containing at least a batch material zone, a melting zone, and a as-grown crystal zone during the use, the melt zone adjacent the high-temperature zone during the use, and a ceramic powder between the crucible and the ceramic member, whereby the ceramic power stabilizes the crucible within the ceramic member during the use.

According to another alternative and optional aspect of the present invention, a crystal growth system is provided, further comprising: a ceramic member in the molten reservoir assembly, the outer surface being an outer boundary of the ceramic member, a reservoir in the reservoir assembly, the reservoir containing at least a batch melt and a ceramic powder between the reservoir and the ceramic member, whereby the ceramic power stabilizes the reservoir within the ceramic member during the use.

According to another alternative and optional aspect of the present invention, a crystal growth system is provided, for preparation of single crystals of lead-contained solid solutions using a platinum crucible, with or without a seed crystal.

According to another alternative and optional aspect of the present invention, a crystal growth system is provided, for preparation of single crystals of lead-contained solid solutions using platinum crucible, with or without PbO flux-association.

According to another alternative and optional aspect of the present invention, a crystal growth system is provided, with or without $PbB_2O_4$ cover layer on the surface of melt.

The above and other objects, features and advantages of the present invention will become apparent from the following description read in conduction with the accompanying drawings, in which like reference numerals designate the same elements.

DETAILED DESCRIPTION OF THE PREFERRED EMBODIMENTS

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Figure 2:
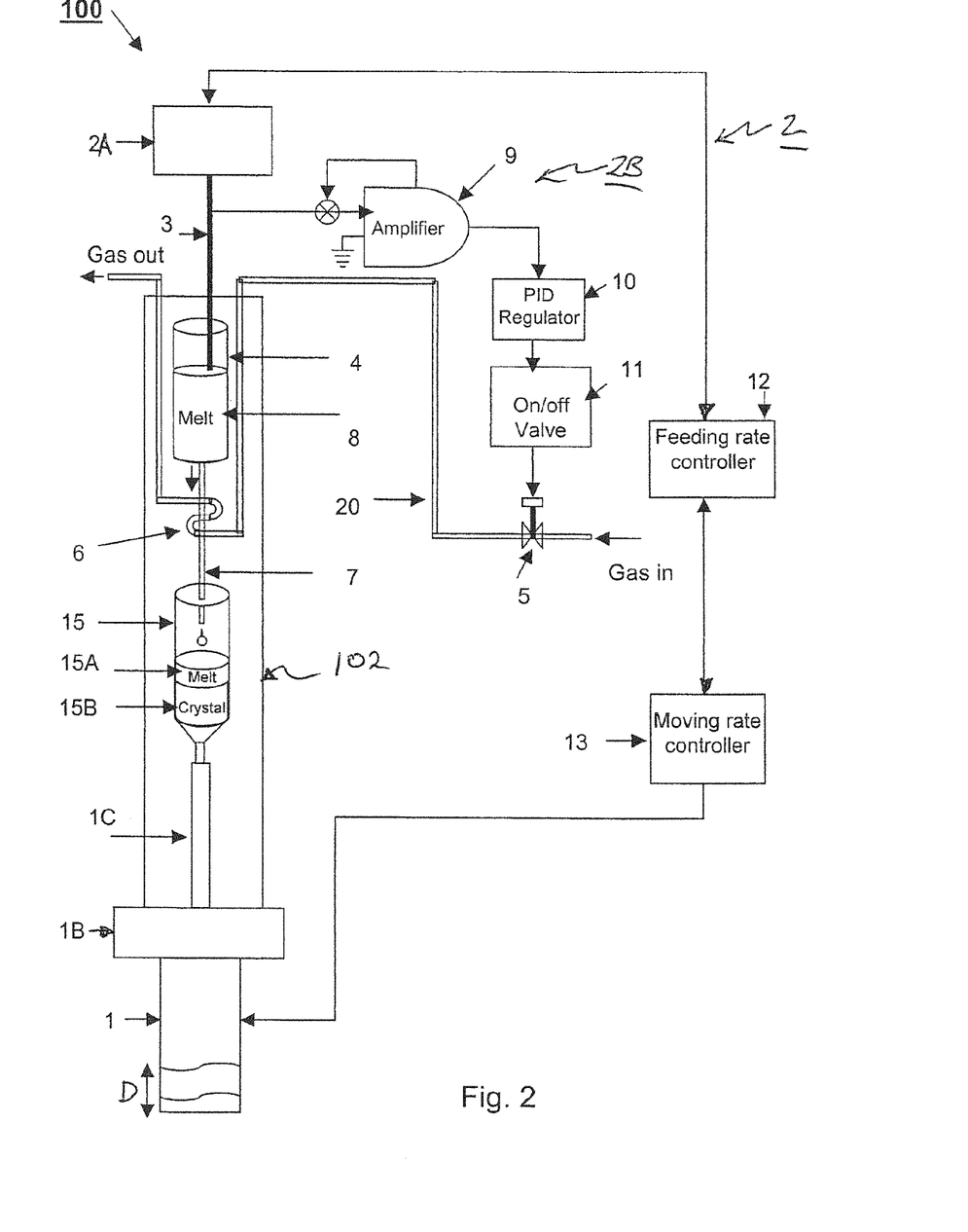
FIG. 2 is a schematic diagram of a closed loop auto-feeding (top loading) facility and crystal growth system according to the present invention.

Referring now to FIG. 2, a top loading auto-feeding crystal growth system 100 is provided having a closed loop. A vertical moving system 1 (a positioning means) includes a support base 1B is provided with a mechanical, electrical, hydraulic, or pneumatic driving system for movement along direction D relative to a vertical position at a rate R of between about 0.2 and 10.0 mm/hr. A sealed ceramic enclosure 102 is supported on support base 1B and operably encloses the crystal growing elements of growth system 100, as will be discussed, and allows the same to operate in a non-reactive atmosphere (Argon, Nitrogen, Ar/Ni, noble gas, $He_2$, etc.) so as to minimize unintended oxidation or reduction reactions.

A bottom rigid support 1C supports crystal growth crucible 15 containing a growth seed portion (not shown), a growth crystal 15B and a melt portion 15A, as shown. Crystal growth crucible 15 is sealed from the atmosphere but for an entry seam joining a platinum feeding conduit 7 extending in a sealed from a batch melt crucible 4 having a reservoir of melt 8.

Feeding conduit 7 may be composed of any suitable material and of any suitable length, size, shape, and wall thickness without departing from the scope and spirit of the present invention. Applicants have determined that one alternative preferred material for feeding conduit is platinum (Pt) for its high temperature performance and non-reactivity. The preferred feeding conduit 7 has a necessary length and outer diameter (OD) of approximately 2.0-4.0 mm, and an inner diameter (ID) of approximately 1.0-2.0 mm, and more preferably 2.0-3.0 mm(OD)/1.0-1.5 mm(ID). Since feeding conduit 7 directly and sealingly joins melt crucible 4 with growth crucible 15, without system 100 is referred to as a closed-loop type system. Consequently, with the dimensions noted above, the present invention proposes that a crystal may be grown at a rate of approximately 0.1-0.4 mm/hr, and preferably at a rate of approximately 0.2-0.3 mm/hr, for a standard sized boule having a 3-4 inch diameter and a usable length of 2-12 cm.

A melt level measuring system and vertical movement control system 2 (a controlling, interfacing, inputting, and thermally monitoring system) is provided and includes a platinum (Pt) probe moving mechanism 2A operatively moving and controlling a platinum probe 3 for determining a current melt level. Additionally, control system 2 operatively controls vertical movement system 1 with a moving rate controller 13 and a feeding rate controller 12 for determining a feeding rate in balance with the moving rate. While not shown, measurement and movement control system 2 is understood to be computer controlled and can record and track data changes in positions throughout a growth cycle.

As a consequence, while difficult to produce it is recognized that the melt material may be selected from any of a plurality of related systems, including PIN-PT-PMN, PybN-PMN-PT and BiSc-PMN-PT ternary systems, but that the present invention preferably provides a form of crystalline based material wherein the PMN-PT based material is the selected composition having at least one of the following formulas:

$$Pb(Mg_{1/3}Nb_{2/3})_{1-x}Ti_3O_3 \tag{IV}$$

wherein x is defined as molar % 0.00 to 0.50 and, $$(1-y)Pb(Mg_{1/3}Nb_{2/3})_{1-x}Ti_xO_3+yPb(R_{1/2}Nb_{1/2})O3 \tag{V}$$

wherein x is defined as molar % 0.00 to 0.50, y is defined as Molar % 0.00 to 0.35, and R is selected from at least one element of Bi, Fe, Sc, Yb, Sb, In, Co, and Zr, or a combination of the above elements.

Additionally, following operation the present invention is intended to provide a PMN-PT based material, comprising: a single crystal, and the single crystal having a formula:

$$(1-y)Pb(Mg_{1/3}Nb_{2/3})_{1-x}Ti_xO_3 + yPb(R_{1/2}Nb_{1/2})O_3 \qquad (VI)$$

wherein x is defined as molar % 0.00 to 0.50, y is defined as molar % 0.00 to 0.35, and R is selected from at least one element of Bi, Fe, Sc, Yb, Sb, In, Co, and Zr, or a combination of the above elements.

It will be recognized, that the present embodiment is within a furnace environment having at least two and preferably three multiple heating zones, wherein during operation the furnace (shown later) is operated at up to less than 1480° C., and is ramped to that temperature at a rate of 100° C./hr, and ultimately held at a furnace temperature at 1430~1480° C. for 3 to 8 hrs, while operably adjusting positions of each crucible assembly 4, 15 and regulating the furnace temperature to confirm the following conditions for each respective crucible 4, 15 during the hold time:

(e) maximum temperature in a melting zone of less than about 1365° C.,
(f) temperature of the melt crucible reservoir 8 in an upper sub-high temperature zone is between 1300 to 1350° C.,
(g) vertical temperature gradient at a middle of a crystal seed of greater than 15° C./cm, and preferably greater than 20° C./cm, and
(h) crucible equilibrium temperature within +/−2° C./hr change, and soaking each crucible for a minimum 2 hours after achieving crystal growth.

Measurement and movement control system 2 additionally includes a thermal monitoring and control system 2B, including probe 3, for controlling the feed rate of melt along sealed feeding conduit 7. Control system 2B additionally includes in operative arrangement a signal amplifier 9, a PID controller 10 of the type known in the furnace arts, and a flow valve control 11 for a flow valve 5 controlling a gas flow along a gas flow line 20. As assembled, a portion of gas flow line 20 includes a platinum (Pt) high temperature valve portion 6 (a thermal valving means 6) that is thermally monitored and within heated container 102 in close proximity to melt conduit 7. Preferably thermal valving portion 6 is directly wrapped about melt conduit 7 in one to four turns. The gas fed along gas flow line 20 may be any suitable gas to accomplish the effect noted below, but is preferably from dry-Air, Argon, Nitrogen, and other low-cost gases for cost reduction reasons without departing from the scope and spirit of the present invention. Preferably the gas selected from operation has a preferred thermal conductivity such as that of argon so as to allow a rapid thermal transfer from gas flow line 20 to melt conduit line 7.

During steady state operation with little, minimal, or no gas flow along gas flow line 20, melt liquid will transit conduit line 7 as rapidly as possible under the effect of gravity limited by the Inner Diameter (ID) (the temperature of transit line 7 being above the liquidus/solidus transition zone of the particular melt selected for boule growth. However, the present thermal control and flow control system 2 operates gas flow line 20 (to increase gas flow) to effectively cool conduit line 7 sufficiently to drop the temperature of conduit line 7 below the solidus point of the particular melt employed in melt crucible 4, thereby phase transforming the liquid melt in conduit line 7 to a solid and stopping the fluid melt flow. Consequently, crystal growth system 100, employing the effective elements noted above, can effectively stop and start melt flow along conduit line 7 and consequently control the growth rate of the boule in growth crucible 25. It will be recognized that when thermal control and flow control system 2 reduces or ends gas flow along gas flow line 20, the inherent temperature of the furnace (not shown) surrounding container 102 will heat conduit line 7 above the phase transformation temperature of the melt material and melt will again flow along conduit line 7.

Figure 3:
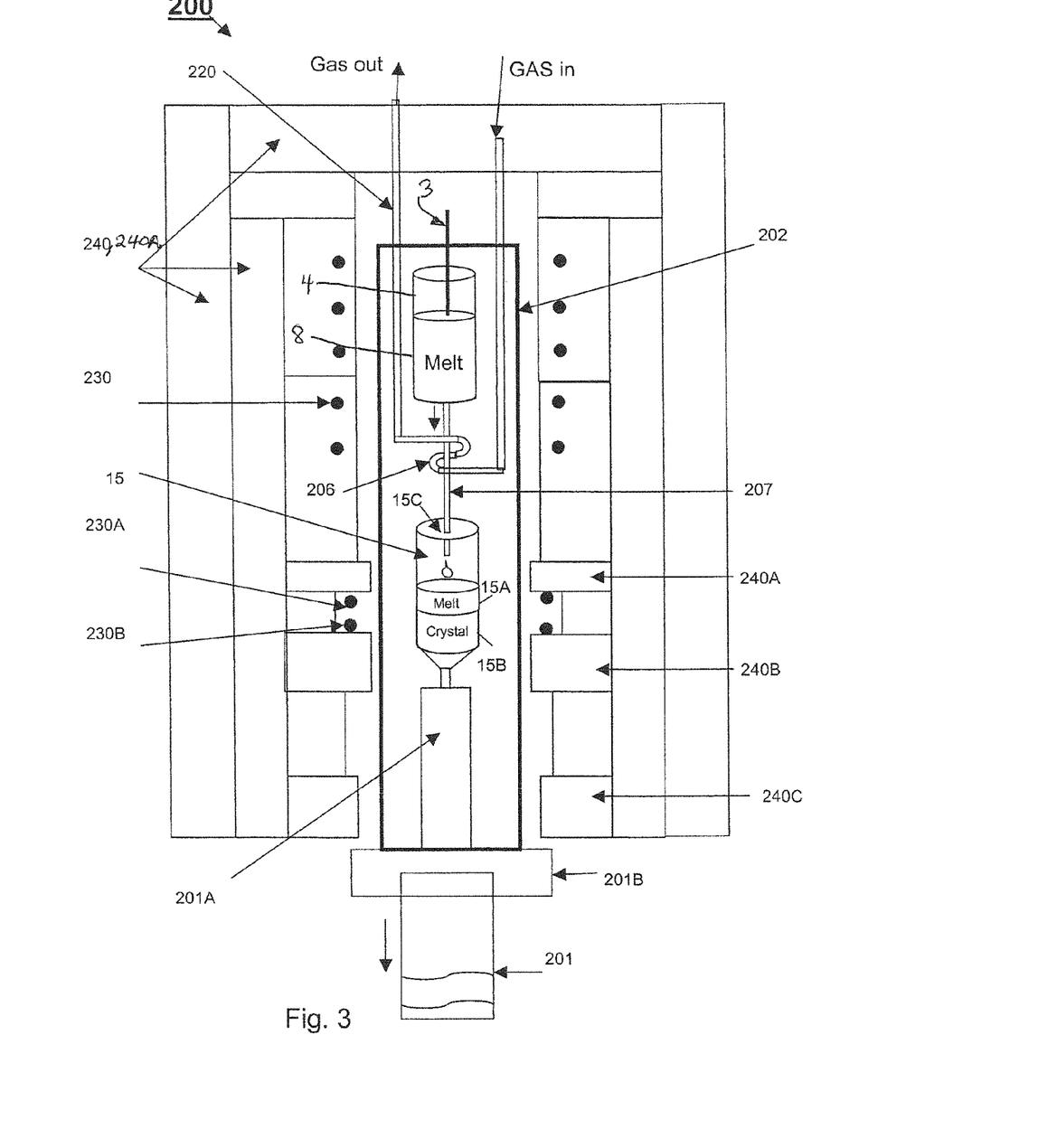
FIG. 3 is a schematic diagram of a closed loop auto-feeding (top loading) system and method according to another aspect of the present invention.

Referring now to FIG. 3, comprehensive a top loading auto-feeding crystal growth system 200 is provided having a closed loop system similar to the embodiment in FIG. 1, but now shown including a surrounding furnace brick structure 240A having a plurality of thermal bricks 240 and a plurality of melt zone heating elements 230, and lower temperature gradient between thermal boundary layers 240A, 240B having a plurality of zone heating elements 230A, 230B. An additional bottom thermal boundary element 240C additionally serves to moderate and control temperatures within furnace 240A as discussed within Applicant's incorporated herein by reference U.S. Pat. No. 6,942,730. As discussed therein thermal zone control provides thermal management benefits.

As discussed earlier in FIG. 2, system 200 includes melt crucible 4 having melt level probe 3, and an operative and controlled vertical crucible motion system 201 having a support member 201B and a crucible support member 201A supporting melt crucible 15 containing a sealed top 15C, a melt portion 15A, and a crystallized/grown boule portion 15B, along with a seed crystal (not shown). An outer sealed chamber 202 is supported on motion system 201 as shown and has openings for operative control of gas in/out, the melt level probe 3, and thermal control of the same.

A melt conduit line 207 is sealed to sealed top 15C for melt access to melt crucible 15 and is also sealed to a bottom portion of melt crucible 4 to allow the transfer of liquid melt.

A thermal control valve system similar to that above, includes a gas transfer tube 220 positioned in close proximity of a portion of melt conduit line 207 forming a thermal control region 206 for thermally controlling melt flow along line 207 via solidifying and melting the same as discussed above.

In considering both systems 100 and 200 (FIGS. 2 and 3), those of skill in the art will know realize that the proposed system provides a melt flow control system based on a thermal control of the flow conduit to the crystal growth crucible.

Referring now to FIG. 3, a growth system 400 with top loading and an open-loop form of automation is provided with a fixed position upper furnace 340 containing a temperature controlled melting region 304 and a fixed position melt crucible 301 containing melt 308. At least one heating element 306 is provided for temperature control, and it is recognized that furnace 340 will have other required temperature sensors, controllers, and operating systems to control the temperature therein and of melt crucible 301.

A platinum (Pt) conduit 302 extends from the bottom of melt crucible 301 and is formed with a motion transfer or absorbing section M, shown here as a coil circling crucible 301, although the present invention is not limited to such construction. It will be recognized that motion transfer or absorbing section M operates as a motion transfer means allowing conduit 302 to move relative to fixed melting crucible 301 as will be discussed.

A vertical motion control system 350 is provided similar to earlier motion control systems discussed above, and similarly a bounded container 370 is provided thereon, wherein a support mechanism 3505A supports a crystal growth crucible 315 containing a melt portion 315A and a crystallized portion 315B, and a sealed top member 315C joining an end of conduit 302, as shown.

As will be recognized from the construction, while conduit 302 extends from fixed upper reservoir furnace 340, an extended portion 303A is employed to transfer the melt through a temperature controlled region 305 so as to maintain conduit 302 in a suitable condition for melt flow, or as desired by an controller, to cool conduit 302 providing a thermal control valve mechanism similar to that discussed above in FIGS. 2 and 3.

In continuous operation of system 300, it will be recognized that temperature controlled region 305 and bounded region 370 are effective to maintain and control an operative thermal condition for melt transfer and crystal growth. For example, region 370 may be with an earlier discussed furnace region, and temperature controlled region 305 may extend from the furnace region a distance away to the upper furnace 340. As a consequence, it will be recognized, that more than one melt crucible and more than one crystal growth crucible may be employed without departing from the scope and spirit of the present invention.

Here, melt crucible 301 and growth crucible 315 have the same inner diameter. A level transfer portion 303 (here a horizontal portion) of conduit 302 transits a moving slit 320 in thermal wall 304 of furnace 340 so as to allow free vertical motion (via motion controller 350) of growth crucible 315. As a consequence of this design, while crystal growth crucible 315, transfer portion 303A, horizontal transfer portion 303 moves downwardly via automatic controlled feeding along direction X, the motion absorbing section M of conduit 302 absorbs this motion without disturbing fixed melt crucible 301 but changes the relationship between 301 and the top flow conduit portion 303.

It will be realized that in conventional crystal growth systems, controlling melt levels in a crystal growing crucible is inherently difficult, particularly where different diameter crucibles are employed. Since system 300 is an open loop system there is no inherent "valve" type control on conduit 302 (other than an additional thermal valve control which may be included as noted above). Consequently, during operation as a melt level is determined in melt crucible 301, melt flows along conduit 302, through motion absorbing and transfer region M and horizontal or top conduit or flow region 303 and then falls under the force of gravity to growth crucible 315 forming level 315A. It will be recognized by those of skill in the art as a natural law that fluid levels (even of liquid crystalline materials) at different ends of a tube always seek a common level, hence when the melt level in crucible 301 is at or above horizontal portion 303 (also referred to as a peak or top portion), melt balance relative to horizontal or top conduit or flow region 303 and will thereafter will flow to growth crucible 315 and form melt level 315A operating in a complete fluid flow control mechanism. Upon depleting melt at an available level below horizontal portion 303 (peak or top portion of melt conduit), the flow will stop until 350 reduces conduit peak position 303 again and matches the height of melt 308.

Since one end of conduit 302 is fixed in position to melt crucible 301, and the opposing end is fixed to movable growth crucible 315, it will be recognized that a controller controlling motion along direction/distance X necessarily controls the motion of horizontal portion 303 along slit 320 and the motion along motion range M. As a consequence, where an automated driving controller (not shown but discussed earlier) drives growth crucible 315 downwardly the automated controller necessarily controls and feeds the melt flow rate by controlling the position of peak level 303 until the levels are balanced as a fluid flow control means (where, for example similar diameter crucibles are employed). Thus, once an optimal flow rate (for example 1 mm/hr) is determined, the automated driving controller drives 350 and crucible 315 according to that rate, and the melt flow is automatically controlled via the fluid flow control means discussed to feed only as necessary to maintain the level. This controlling mechanism of this fluid flow controlled open looped system may be additionally combined (but is not required to be combined) with a thermal control valve means discussed regarding FIGS. 2 and 3) forming a dual-control system for melt flow.

Figure 5:
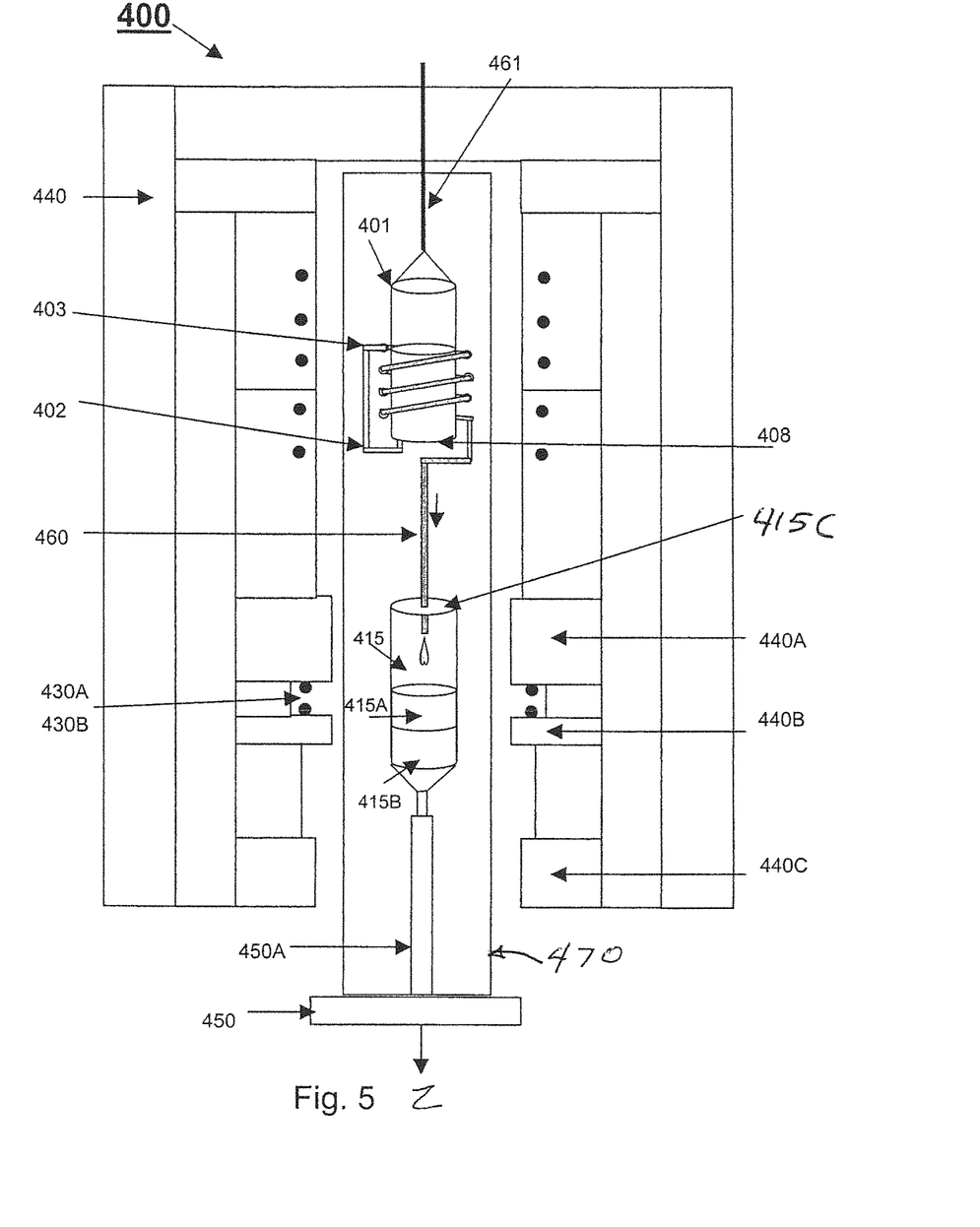
FIG. 5 is a schematic diagram of another open-loop auto-feeding (top loading) facility and crystal growth system according to another aspect of the present invention with the melt furnace suspended relative to growth crucible moving during crystal growth.

Referring now to FIG. 5, an additional a growth system 400 is provided with top loading and an open-loop form of automation is provided with a fixed position of an upper melt crucible 401 containing a temperature controlled melt within a furnace construction 440 including a number of heating elements (shown).

A fixing support member 461 fixably suspends melt crucible 401 containing melt 408 relative to furnace 440 within an operating chamber 470 as discussed earlier and prevents downward movement along direction Z as controlled by an automated downward control system 450 including a support member 450A. At least a plurality of heating elements 430A, 430B between thermal barriers 440A, 440B are positioned within furnace 440 for managing crystal growth within crucible 415. An additional set of bottom thermal barriers 440C may be provided to additionally control thermal gradients within furnace 440.

Growth crucible 415 includes a crystal portion 415B and a melt portion 415A, and has a sealed top 415C fixed to conduit 402, although such sealing is not required as long as the control of conduit tube 402 is fixed relative to crucible 415.

Melt conduit 402 extends from melt crucible 401 and includes a motion absorbing region (shown) and has an upper most portion or horizontal portion 403 (no requirement is made for horizontal positioning as long as a top position is determined, this is the level of melt 408 within crucible 401.

Figure 4:
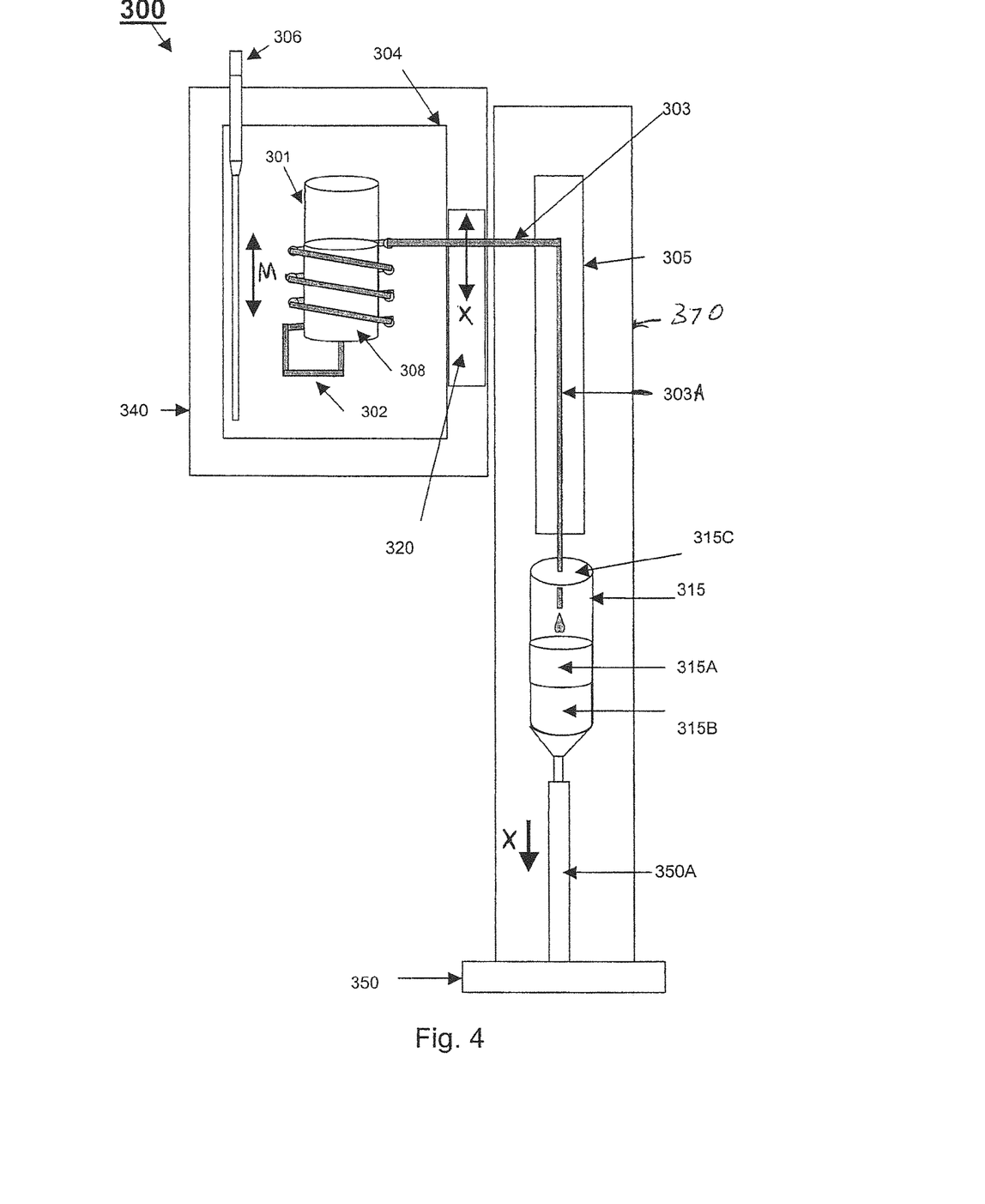
FIG. 4 is a schematic diagram of an open-loop auto-feeding (top loading) facility and crystal growth system according to another aspect of the present invention with the melt furnace remaining stationary (bottom support) and the growth crucible moving during crystal growth.

As was discussed earlier in reference to FIG. 4, as motion control is exercised by a controlling system (not shown but discussed earlier), conduit 402 is drawn downwardly and an extending portion 460, which may or may not include it's own thermal control region and its own thermal control valve (as discussed previously), extends along direction Z remaining fixably positioned relative to growth crucible 415.

Here again, melt crucible 401 and growth crucible 415 have the same inner diameter allowing simplified calculation of growth rates. Top or maximum transfer portion 403 of conduit 402 transits and moves along fixed melt crucible 401 so as to allow free vertical motion (via motion controller 450) of growth crucible 415. As a consequence of this design, while crystal growth crucible 415, transfer portion 403, etc. move downwardly via automatic controlled feeding along direction Z, the motion absorbing section (shown but not identified) of conduit 402 absorbs this motion without disturbing fixed melt crucible 401.

Additionally, as similarly noted above, the melt level in melt crucible 401 will remain even with the upper transfer portion 403 of conduit 402 so that feeding to growth crucible 415 is always level and balanced with the melt rate. As a consequence of the design of system 400, related to system 300 above, it will be apparent to those of skill in the art that the similar fluid flow principles and natural fluid flow laws apply in the Earth's gravity well allowing the present system 400 to operate without undue complexity, directly matching the downward driving rate and distance allowing ready control and tracking over long (40 days+) crystal growing periods and at an economic and reasonably constructed system design.

Figure 6A:
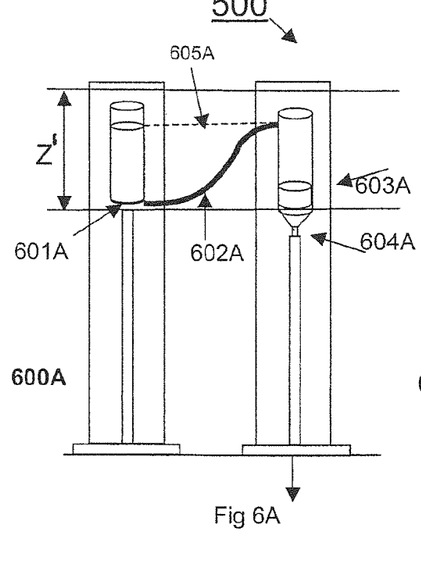
FIGS. 6A-6D are schematic representational views of four stages of elapsed time during crystal growth in the system according to FIG. 5 or 6.
Figure 6B:
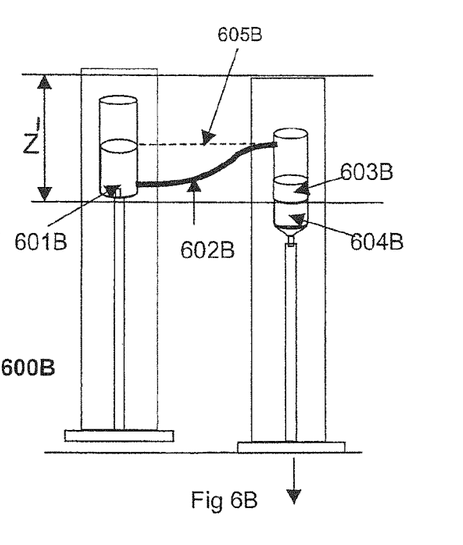
Figure 6C:
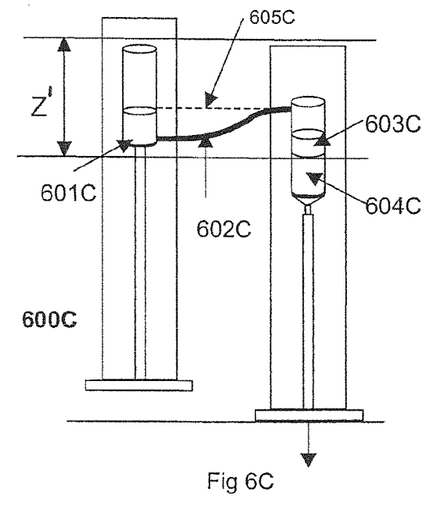

Referring now to FIGS. 6A-6B, a crystal growth process 500 is visualized and discussed for an open loop, auto-feeding (top loading), growth system (See FIGS. 4 and 5) from an initial start stage 600A (FIG. 6A) to a completion stage 600D

Figure 6D:
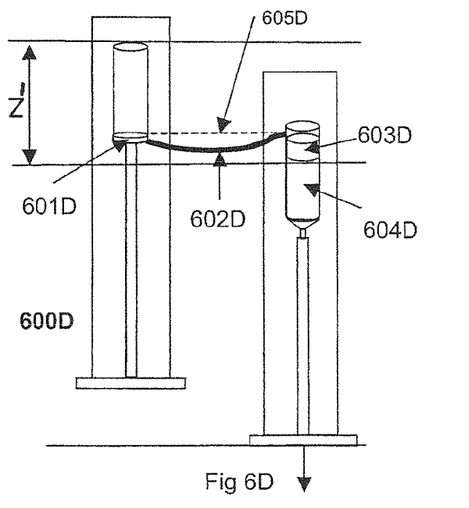

(FIG. 6D). A hot-zone above a melting temperature is noted as Z', so that in each figure, the melt crucible 601A, 601B, 601C, and 601D is within the melting temperature zone allowing the generation of a fluid melt flow and the establishment of a respective fluid melt level 605A, 605B, 605C, and 605D.

As will be noted from the figures, the crystal growth crucibles each contain a crystallized portion 604A, 604B, 604C, and 604D, respectively below the melting zone Z'. As will also be noted, as each respective crystallized portion 604A-D increases, the crystal growth crucible travels downwardly in direct relation to the reducing melt level 605A-D, while the respective melt levels 603A, 603B, 603C, and 603D in each respective crystal growth crucible remains the same. As a consequence, it will be apparent to those of skill in the art that by because the end of the melt conduit 602A-D is fixed to each respective crystal growth crucibles, and a portion of the melt conduit 602A-D is on the same level as the actual melt level, as the crystal growth crucible travels downwardly, melt flows to re-establish a fluid balance between these two points. As an additional consequence, those of skill in the crystal growing arts will appreciate that based upon the proposed systems herein, by controlling the rate of crucible movement (relative to the temperature zone) the rate of crystal growth is directly controlled, in either a direct relationship or a proportional relationship based upon crucible geometry.

In view of the above discussion, those of skill in the crystal growing arts will additionally appreciate the methods involved in arranging and operating the crystal growth systems.

It will be additionally recognized by those of skill in the art that the present invention additionally enables the use of differing sized melt/growth crucibles with only the requirement of additional computations to match growth rates. Similarly, it will additionally recognized by those of skill in the art that multiple growth crucibles may be joined via multiple conduits to a single melt crucible operating on similar principals without departing from the scope and spirit of the present invention (requiring only additional calculation to match growth/flow rates to geometric diameters). Similarly, the present invention envisions the use of multiple melt crucibles to feed a single growth crucible without departing from the spirit and scope of the present invention (requiring again only additional calculation to match the associated flow and growth rates).

In addition to the above, it will be recognized that benefit of the present invention is that the resultant elemental uniformity of In, Pb, and the other elements identified herein along the length of a grown crystal is substantially increased via such feed and growth control thereby substantially reducing material loss (yield loss) due to variability. Additionally, the control systems are simplified because of the simplified feedback loops (either the melt measurement/thermal valve of the closed loop system or the automated feed rate matched between melt crucible and crystal growth crucible based upon the physics rule that a fluid always seeks its own level (a natural law).

Those of skill in the crystal growing arts will additionally recognize that the proposed growth systems may operate with or without an initial seed crystal without departing from the scope and spirit of the present invention.

In the claims, means- or step-plus-function clauses are intended to cover the structures described or suggested herein as performing the recited function and not only structural equivalents but also equivalent structures. Thus, for example, although a nail, a screw, thermal bonding device, and a bolt may not be structural equivalents in that a nail relies on friction between a wooden part and a cylindrical surface, a screw's helical surface positively engages the wooden part, a thermal bonding device may employ thermal glue or heat-sealing, and a bolt's head and nut compress opposite sides of a wooden part, in the environment of fastening wooden parts, a nail, a screw, a thermal bonding device, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A method of operating a crystal growth system, for growing a crystalline material, comprising the steps of:
   providing a furnace system containing at least a high-temperature melting zone and a sub-high temperature crystal growth zone;
   said sub-high temperature zone having a temperature growth gradient transition range including a liquidus/solidus temperature transition of said crystalline material;
   providing a melting crucible in said high-temperature melting zone containing a melted batch melt of said crystalline material;
   providing a crystal growth crucible in said sub-high temperature zone;
   providing a melt conduit extending from said melting crucible to said crystal growth crucible for a transferring said melted batch melt;
   providing control means for controlling a growth rate of said crystalline material in said crystal growth crucible;
   providing positioning means in said control means for moving at least said crystal growth crucible relative to said sub-high temperature zone to maintain said growth rate and said temperature growth gradient transition range relative to a growth of said crystalline material during a use of said system; and
   providing at least one of a thermal valve means in said control means for thermally controlling said transfer of said melted batch along said melt conduit and a fluid control means in said control means for fluidly controlling said transfer of said melted batch along said melt conduit, whereby said at least one of said thermal valve means and said fluid control means enables an improved composition control by said growth rate.

2. The crystal growth system according to claim 1, wherein said method is at least one of an open loop and a closed loop system.

3. The crystal growth system according to claim 2, said method further comprising:
   a ceramic-based supportive structure supporting said melting crucible, said crystal growth crucible, and said melt conduit during said use whereby said supportive structure enables said positioning means to move said at least crystal growth crucible relative to said sub-high temperature zone to maintain without damage.

4. The method according to claim 2, wherein a gas used by said thermal valve means includes at least one gas selected from the group consisting of Argon, Nitrogen, Air, Argon-Nitrogen Mix, Helium, Hydrogen, and a Nobel Gas.

5. The method according to claim 2, wherein at least one of said melting crucible, said crystal growth crucible, and said melt conduit are constructed from platinum (Pt).

6. The method according to claim 2, wherein said crystalline material includes a PMN-PT-based material.

* * * * *